(12) United States Patent
He et al.

(10) Patent No.: US 9,165,770 B2
(45) Date of Patent: Oct. 20, 2015

(54) METHODS FOR FABRICATING INTEGRATED CIRCUITS USING IMPROVED MASKS

(71) Applicant: GLOBALFOUNDRIES, Inc., Grand Cayman (KY)

(72) Inventors: Ming He, Slingerlands, NY (US); Seowoo Nam, Delmar, NY (US); Craig Child, Gansevoort, NY (US)

(73) Assignee: GLOBALFOUNDRIES, INC., Grand Cayman (KY)

( * ) Notice: Subject to any disclaimer, the term of this patent is extended or adjusted under 35 U.S.C. 154(b) by 0 days.

(21) Appl. No.: 14/037,774

(22) Filed: Sep. 26, 2013

(65) Prior Publication Data

US 2015/0087149 A1     Mar. 26, 2015

(51) Int. Cl.
| | |
|---|---|
| *C03C 15/00* | (2006.01) |
| *C03C 25/68* | (2006.01) |
| *C23F 1/00* | (2006.01) |
| *B44C 1/22* | (2006.01) |
| *H01L 21/033* | (2006.01) |

(52) U.S. Cl.
CPC ........ *H01L 21/0338* (2013.01); *H01L 21/0337* (2013.01)

(58) Field of Classification Search
CPC .. H01L 21/3086; H01L 21/3088; H01L 21/31

USPC ................................................ 216/38, 46, 52
See application file for complete search history.

(56) References Cited

U.S. PATENT DOCUMENTS

| | | | | |
|---|---|---|---|---|
| 5,328,810 | A * | 7/1994 | Lowrey et al. | 430/313 |
| 2006/0240361 | A1* | 10/2006 | Lee et al. | 430/313 |
| 2006/0276043 | A1* | 12/2006 | Johnson et al. | 438/717 |
| 2007/0123053 | A1* | 5/2007 | Kim et al. | 438/736 |
| 2008/0008969 | A1* | 1/2008 | Zhou et al. | 430/313 |
| 2008/0122125 | A1* | 5/2008 | Zhou | 257/797 |
| 2009/0286936 | A1* | 11/2009 | Ogata et al. | 525/328.8 |

\* cited by examiner

*Primary Examiner* — Binh X Tran
*Assistant Examiner* — Thomas Pham
(74) *Attorney, Agent, or Firm* — Ingrassia Fisher & Lorenz, P.C.

(57) ABSTRACT

Methods for fabricating integrated circuits are provided. In an embodiment, a method for fabricating an integrated circuit includes forming a mask overlying a material to be etched by forming first hard mask segments overlying the material to be etched, forming sacrificial mandrels overlying the material to be etched and around each hard mask segment, forming second hard mask segments overlying the semiconductor substrate and adjacent each sacrificial mandrel, and removing the sacrificial mandrels to form first gaps surrounding each first hard mask segment, wherein each first gap is bounded by a respective first hard mask segment and an adjacent second hard mask segment. The method includes etching the material to be etched through the mask.

14 Claims, 4 Drawing Sheets

METHODS FOR FABRICATING INTEGRATED CIRCUITS USING IMPROVED MASKS

TECHNICAL FIELD

The technical field generally relates to lithography, and more particularly relates to methods for fabricating integrated circuits with features having sub-lithographic dimensions.

BACKGROUND

The scaling of integrated circuits has generated a demand for methods for forming nanometer-sized features that are separated by nanometer-sized distances. As the limits of optical resolution are approached in current lithography processes, double patterning processes have been used to provide for sub-lithographic feature size. Specifically, while a conventional lithographic process can be used to form a line-width equal to a minimum critical dimension (CD) associated with the lithographic process, a double patterning process can be used to form a line-width smaller than the CD. Double patterning techniques include "pitch split" (also called litho-etch litho-etch, or LELE) and "sidewall image transfer" (also called self-aligned double patterning or SADP). In each double patterning technique, a pattern that could not otherwise be printed is split into two separate masks.

To obtain even smaller feature sizes, litho-etch litho-etch litho-etch (LELELE) and Double SIT (or self-aligned quadruple patterning or SAQP) techniques have been proposed. These processes present overlay and cost issues. Further, while the Double SIT technique may shrink pitch to about 20 nanometers (nm), it requires two mandrel pulls that frequently result in residual materials within semiconductor structures. Such residual materials are challenging to remove with etching processes at reduced scaling. Further, the Double SIT technique is limited to ¼ and ⅛ scaling and has no flexibility for use with ⅓, ⅙ or ⅑ scaling.

Accordingly, it is desirable to provide methods for fabricating integrated circuits that provide for features having sub-lithographic dimensions. In addition, it is desirable to provide methods for fabricating integrated circuits that provide for a selected scaling, including ⅓, ⅙ or ⅑ scaling. Furthermore, other desirable features and characteristics will become apparent from the subsequent detailed description and the appended claims, taken in conjunction with the accompanying drawings and the foregoing technical field and background.

BRIEF SUMMARY

Methods for fabricating integrated circuits are provided. In accordance with an exemplary embodiment, a method for fabricating an integrated circuit includes forming a mask overlying a material to be etched by forming first hard mask segments overlying the material to be etched, forming sacrificial mandrels overlying the material to be etched and around each hard mask segment, forming second hard mask segments overlying the material to be etched and adjacent each sacrificial mandrel, and removing the sacrificial mandrels to form first gaps surrounding each first hard mask segment, wherein each first gap is bounded by a respective first hard mask segment and an adjacent second hard mask segment. The method includes etching the material to be etched through the mask.

In another embodiment, a method for fabricating an integrated circuit includes forming first hard mask segments overlying a material to be etched and defining a pitch distance from a first side of a selected first hard mask segment to a first side of a respective adjacent first hard mask segment. The method further includes forming second hard mask segments overlying the material to be etched and defining a reduced pitch distance from the first side of the selected first hard mask segment to a first side of a respective adjacent second hard mask segment. The reduced pitch distance is equal to about one-third of the pitch distance. The method also provides for etching the material to be etched using the first hard mask segments and second hard mask segments as a mask.

In accordance with another embodiment, a method for fabricating an integrated circuit includes forming a mask overlying a material to be etched by forming first sacrificial mandrels overlying the material to be etched, forming first hard mask segments overlying the material to be etched and around each first sacrificial mandrel, forming second sacrificial mandrels overlying the material to be etched and adjacent each first hard mask segment, forming second hard mask segments overlying the material to be etched and around each second sacrificial mandrel, and removing the first sacrificial mandrels and the second sacrificial mandrels to form gaps adjacent the first hard mask segments and second hard mask segments. The method provides for etching the material to be etched through the mask.

BRIEF DESCRIPTION OF THE DRAWINGS

Embodiments of methods for fabricating integrated circuits with improved masks will hereinafter be described in conjunction with the following drawing figures, wherein like numerals denote like elements, and wherein.

DETAILED DESCRIPTION

The following detailed description is merely exemplary in nature and is not intended to limit the methods for fabricating integrated circuits as claimed herein. Furthermore, there is no intention to be bound by any expressed or implied theory presented in the preceding technical field, background or brief summary, or in the following detailed description.

In accordance with the various embodiments herein, methods for fabricating integrated circuits using improved masks are provided. The methods provided herein allow for improved patterning at reduced feature sizes. Further, the methods allow for selected scaling and are not limited to ½ or ¼ scaling. To provide improved masks, the methods herein utilize multiple mandrel formation with a single mandrel pull or removal process.

FIGS. 1-8 illustrate steps in accordance with an embodiment of a method for fabricating an integrated circuit 10. FIGS. 9-14 and FIGS. 15-19 illustrate additional or alternate steps in accordance with further embodiments of a method for fabricating an integrated circuit 10. Various steps in the design and composition of integrated circuits are well known and so, in the interest of brevity, many conventional steps will only be mentioned briefly herein or will be omitted entirely without providing the known process details. Further, it is noted that integrated circuits include a varying number of components and that single components shown in the illustrations may be representative of multiple components.

Figure 1:
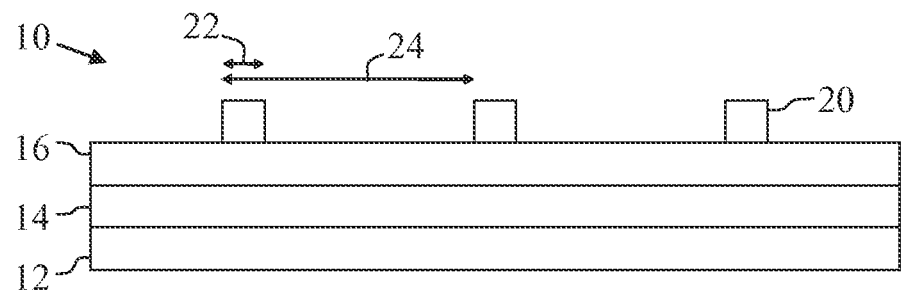
FIG. 1-8 illustrate, in cross section, a portion of an integrated circuit and method steps for fabricating an integrated circuit with a mask formed in accordance with various embodiments herein.

In the exemplary embodiment of FIGS. 1-8, a method for fabricating an integrated circuit 10 includes providing a semiconductor substrate 12 in FIG. 1. An exemplary semiconductor substrate 12 is formed from semiconductor material such as silicon, including the relatively pure silicon materials typically used in the semiconductor industry as well as silicon admixed with other elements, such as germanium and the like. Alternatively, the semiconductor substrate 12 can be realized as germanium, gallium arsenide, and the like, or the semiconductor substrate 12 can include layers of different semiconductor materials. The semiconductor substrate 12 may be realized as a bulk silicon or silicon-on-insulator (SOI) wafer. The substrate 12 may be any semiconductor wafer mentioned above, with front-end of line devices and middle-of-line contact processed, ready for back-end of line interconnect processing. A target layer 14 is formed on or from the semiconductor substrate 12. Target layer 14 may be formed of a high dielectric constant ("high-k") metal gate material or of silicon for a gate layer or formed of silicon or silicon on insulator (SOI) for an active silicon layer of a FinFET device. For back-end of line interconnect, the target layer 14 may be formed of a low-k interlayer dielectric material. As used herein, "high dielectric constant" or "high-k" means having a dielectric constant greater than silicon oxide (3.7). "Low-k" means having a dielectric constant smaller than 3.7.

A first layer 16 may be formed on the target layer 14. The first layer 16 is used as a hard mask for the target layer 14 or may be the target layer 14 itself. First upper hard mask segments 20 having a width or critical dimension (CD), indicated by double headed arrow 22, are formed overlying first layer 16. The first upper hard mask segments 20 may be formed from a hard mask forming layer of deposited silicon oxide, silicon nitride, silicon oxynitride, polycrystalline silicon, amorphous silicon, amorphous carbon, a carbon-doped silica (SiCOH), or another material suitable. The hard mask forming layer may be blanket-deposited using, for example, a PECVD, a low pressure chemical vapor deposition (LPCVD), or another CVD process. In an exemplary embodiment, the hard mask forming layer is polycrystalline silicon having a thickness in a range of from about 20 nanometers (nm) to about 1 micron ($\mu m$), and is preferably from about 50 nm to about 1 $\mu m$ thick. A suitable patterned soft (photoresist) mask is formed overlying the hard mask forming layer using a conventional lithography process, and the hard mask forming layer is anisotropically etched to form first hard mask segments 20 using a conventional lithography process. The etch may be performed by, for example, plasma or reactive ion etching (RIE) using chemistries based upon carbon trifluoride/oxygen ($CHF_3/O_2$) to etch silicon nitride, and CHF3 or carbon tetrafluoride ($CF_4$) to etch silicon oxide or oxynitride, ozone ($O_3$), $O_2$, ammonia ($NH_3$) to etch amorphous carbon, hydrogen bromide/oxygen ($HBr/O_2$) to etch silicon, or octafluorocyclobutane ($C_4F_8$) and $CF_4$ to etch SiCOH. For polysilicon first hard mask segments 20, the first layer 16 may be formed of an inorganic material, such as silicon dioxide ($SiO_2$) or an advanced patterning film, such as amorphous carbon, titanium nitride (TiN) or a silicon-containing organic underlayer.

The first upper hard mask segments 20 are positioned with a pitch distance (PD), indicated by double headed arrow 24. The pitch distance may be equal to the minimum lithographic pitch that can be generated. In the illustrated embodiment, the pitch distance is six times the critical dimension, i.e., PD=6 (CD). Generally, PD=N (CD), where N is 6, 8, 10, 12, or another number, particularly an even number, as desired.

Figure 2:
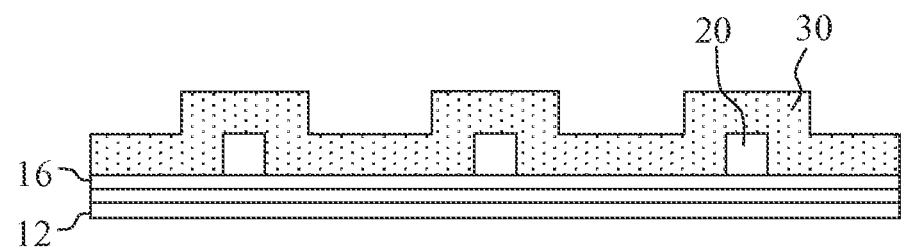

In FIG. 2, a mandrel layer 30 is conformally deposited over the entire substrate 12. The mandrel layer 30 may be deposited by atomic layer deposition (ALD), PECVD, a low pressure chemical vapor deposition (LPCVD), or another CVD process. An exemplary mandrel layer 30 contacts the first layer 16 and encapsulates the first upper hard mask segments 20. Mandrel layer 30 may be formed of silicon nitride, silicon dioxide, or any type of organic or inorganic material having etch selectivity with respect to first upper hard mask segments 20.

Figure 3:
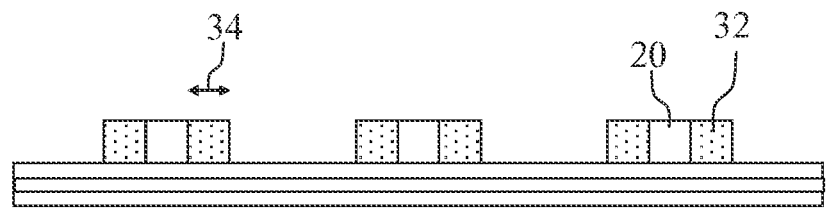

The mandrel layer 30 is etched to form first mandrels 32 in FIG. 3. An exemplary etch uses an RIE process with chemistries based upon $CHF_3/O_2$ to etch silicon nitride, and $CHF_3$ or $CF_4$ to etch silicon oxynitride or silicon oxide. The first mandrels 32 are formed with a width, indicated by doubled headed arrow 34. In the illustrated exemplary embodiment, the first mandrels 32 are formed with the width 34 that is substantially equal to the critical dimension of the first upper hard mask segments 20. As shown, the first mandrels 32 surround each first upper hard mask segment 20. In an exemplary embodiment, an anisotropic etch is performed followed by planarization of both first upper hard mask segments 20 and first mandrels 32.

Figure 4:
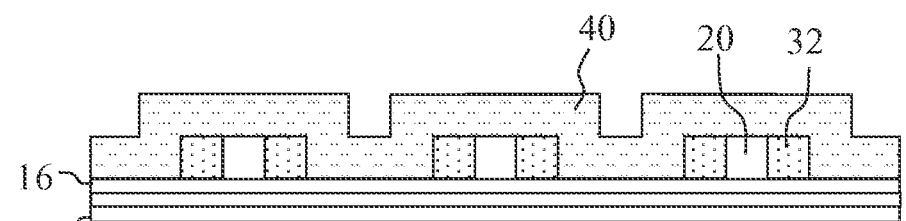

Referring now to FIG. 4, a hard mask forming layer 40 is deposited over the substrate 12. As shown, the hard mask forming layer 40 is conformally deposited overlying the first upper hard mask segments 20 and around the first mandrels 32. An exemplary hard mask forming layer 40 contacts the first layer 16 and encapsulates the first mandrels 32 and first upper hard mask segments 20. The hard mask forming layer 40 may be formed of polysilicon, a photoresist, or any suitable material that has etch selectivity with first mandrels 32. In exemplary embodiments, the hard mask forming layer 40 is formed from the same material as the first upper hard mask segments 20.

Figure 5:
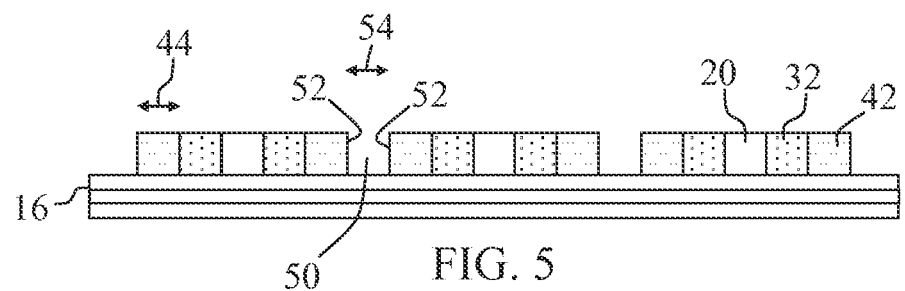

In FIG. 5, the hard mask forming layer 40 is etched to form second upper hard mask segments 42. Specifically, the hard mask forming layer 40 is etched by a timed reactive ion etch. In an exemplary embodiment, the anisotropic etch is performed and followed by planarization of the first upper hard mask segments 20, the first mandrels 32 and the second upper hard mask segments 42. Exemplary second upper hard mask segments 42 are formed with a width, indicated by doubled headed arrow 44, that is substantially equal to the critical dimension of the first upper hard mask segments 20. As shown, the second upper hard mask segments 42 are adjacent the first mandrels 32. Further, in the illustrated embodiment, gaps 50 are formed between exposed side surfaces 52 of adjacent second upper hard mask segments 42. In the illustrated embodiment, the gaps 50 have a width, indicated by doubled headed arrow 54, that is substantially equal to the critical dimension of the first upper hard mask segments 20.

Figure 6:
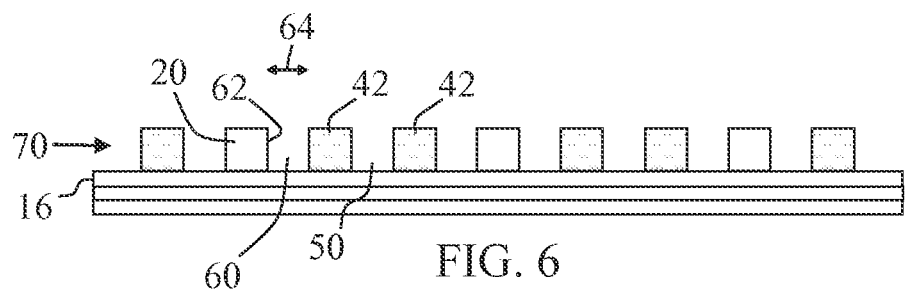

As shown in FIG. 6, the first mandrels 32 are removed by a selective etch process, such as by a reactive ion etch process using a similar chemistry to that described above in relation to formation of the first mandrels 32. As a result, gaps 60 are formed around each first upper hard mask segment 20 between the exposed side surfaces 62 of each first upper hard mask segment 20 and the adjacent second upper hard mask segment 42. The gaps 60 have a width, indicated by doubled headed arrow 64, that is substantially equal to the critical dimension of the first upper hard mask segments 20. In other words, the gaps 60 adjacent first upper hard mask segments 20 upper hard mask segments 20 first upper hard mask segments 20 have the same width as the gaps 50 between second upper hard mask segments 42. The upper hard mask segments 20 and 42 form a mask 70.

Figure 7:
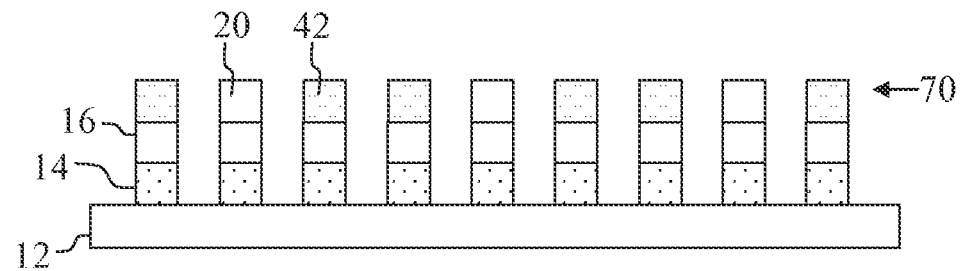
Figure 8:
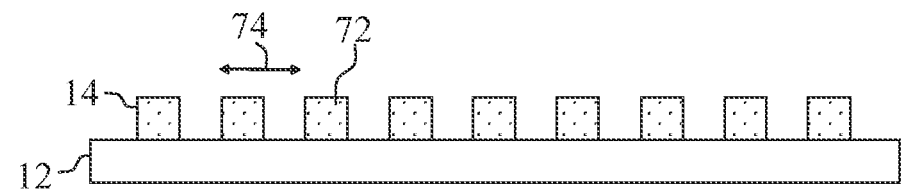

The upper hard mask segments 20 and 42 are used as part of mask 70 to pattern the first layer 16 and the target layer 14 overlying the substrate 12 in FIG. 7. In an exemplary embodiment, the etch process is performed by a reactive ion etch process. In FIG. 8, the upper hard mask segments 20 and 42 and the first layer 16 are removed, such as by an RIE process or a wet etch process. As shown, the features 72 formed by patterning target layer 14 are provided with a pitch distance, indicated by double headed arrow 74 that is less than the minimum pitch distance 24 of FIG. 1. In the illustrated embodiment, the pitch distance 74 is about one-third of the pitch distance 24.

The process illustrated in FIGS. 1-8 can achieve several technical effects, including forming sub-resolution features having different critical dimensions. The present disclosure provides industrial applicability in any of various types of highly integrated semiconductor devices such as SRAMs, logic devices, and IO devices.

Figure 9:
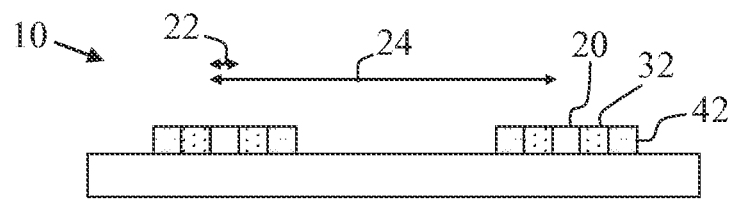
FIGS. 9-14 illustrate, in cross section, a portion of an integrated circuit and additional method steps for fabricating an integrated circuit with a mask formed in accordance with alternate embodiments herein.

Referring now to FIGS. 9-13, additional steps are disclosed for other embodiments for fabricating an integrated circuit. In FIG. 9, the first upper hard mask segments 20 upper hard mask segments 20 first upper hard mask segments 20 have been formed in accordance with the steps of FIGS. 1-8 with a pitch distance 24 that is about twelve times the critical dimension or width 22 of the upper hard mask segments 20. First mandrels 32 and second upper hard mask segments 42 are formed around the first upper hard mask segments 20 upper hard mask segments 20 first upper hard mask segments 20 in accordance with the steps of FIGS. 1-8.

Figure 10:
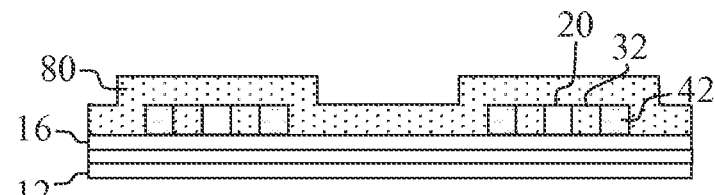

A mandrel forming layer 80 is conformally deposited over the entire substrate 12 in FIG. 10, such as by a PECVD, a low pressure chemical vapor deposition (LPCVD), or another CVD process. An exemplary mandrel forming layer 80 contacts the first layer 16 and encapsulates the second upper hard mask segments 42, the first mandrels 32, and the first upper hard mask segments 20. Mandrel forming layer 80 may be formed of silicon nitride, silicon dioxide, or any type of organic or inorganic material having etch selectivity with respect to second upper hard mask segments 42.

Figure 11:
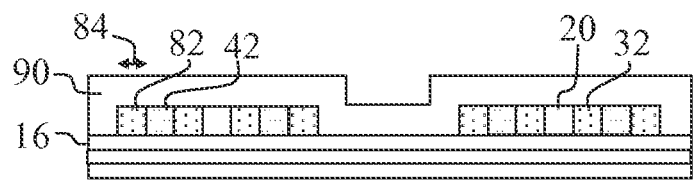

The mandrel forming layer 80 is etched to form second mandrels 82 in FIG. 11. An exemplary etch uses an RIE process with chemistries based upon $CHF_3/O_2$ to etch silicon nitride, and $CHF_3$ or $CF_4$ to etch silicon oxynitride or silicon oxide. The second mandrels 82 are formed with a width, indicated by doubled headed arrow 84. In the illustrated exemplary embodiment, the second mandrels 82 are formed with the width 84 that is substantially equal to the width 22 of the upper hard mask segments 20. As shown, the second mandrels 82 are adjacent each second upper hard mask segment 42.

As shown, a hard mask forming layer 90 is deposited over the substrate 12. The hard mask forming layer 90 is conformally deposited overlying the second mandrels 82, the second upper hard mask segments 42, the first mandrels 32, and the first upper hard mask segments 20 upper hard mask segments 20 first upper hard mask segments 20 and in contact with the first layer 16. The hard mask forming layer 90 may be formed of polysilicon, a photoresist, or any suitable material that has etch selectivity with second mandrels 82. In exemplary embodiments, the hard mask forming layer 90 is formed from the same material as the first upper hard mask segments 20 upper hard mask segments 20 first upper hard mask segments 20 and second upper hard mask segments 42.

Figure 12:
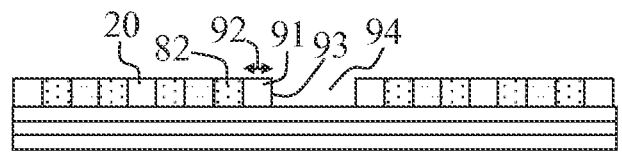

In FIG. 12, the hard mask forming layer 90 is etched to form third hard mask segments 91. The hard mask forming layer 90 may be etched by a reactive ion etch. Exemplary third hard mask segments 91 are formed with a width, indicated by doubled headed arrow 92, that is substantially equal to the critical dimension of the first upper hard mask segments 20. As shown, the third hard mask segments 91 are adjacent the second mandrels 82 and have exposed sides 93 that define a gap 94.

Figure 13:
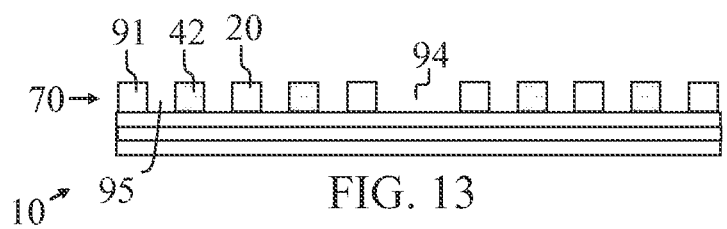
Figure 14:
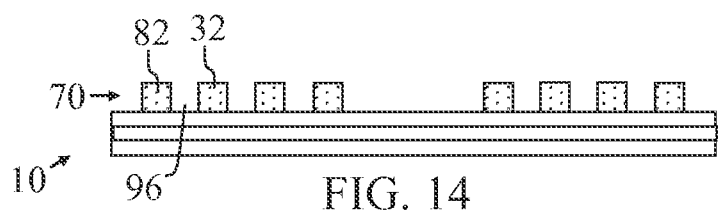

FIG. 13 illustrates a step similar to that of FIG. 6 where both the first mandrels 32 and the second mandrels 82 are removed. As a result, gaps 95 are formed between third hard mask segments 91 and second upper hard mask segments 42, and between second upper hard mask segments 42 and first upper hard mask segments 20. As a result, the upper hard mask segments 20, 42 and 91 form mask 70 with gaps 94 and 95. FIG. 14 illustrates an alternate embodiment in which the upper hard mask segments 20, 42 and 91 are removed and mandrels 32 and 82 form the mask 70 with gaps 96 defined between adjacent mandrels 32 and 82. After forming the structure of FIG. 13 or FIG. 14, the steps of FIGS. 7 and 8 may be performed to further process the integrated circuit 10. Each of the embodiments of FIGS. 13 and 14 provide for reduced feature size beyond that of the steps of FIGS. 1-8.

Figure 15:
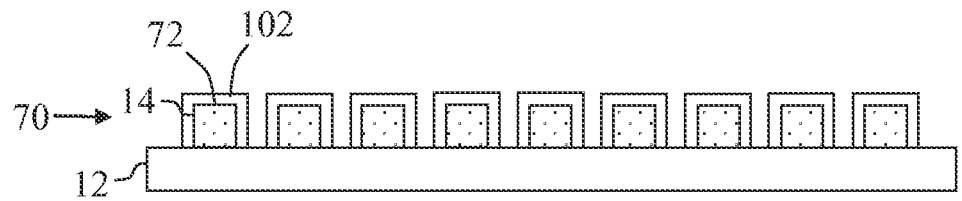
FIGS. 15-19 illustrate, in cross section, a portion of an integrated circuit and additional method steps for fabricating an integrated circuit with a mask formed in accordance with alternate embodiments herein.
Figure 16:
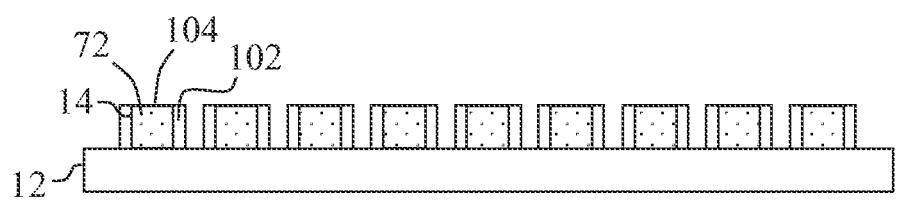
Figure 17:
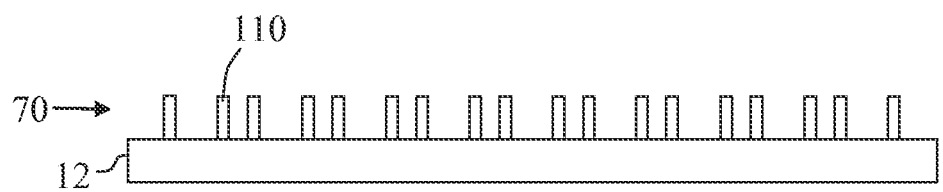

FIGS. 15-19 disclose an embodiment using additional processes for forming the mask 70. In FIG. 15, a sidewall spacer 102 is deposited over the features 72 formed from target layer 14 such as in FIG. 8. For example, the sidewall spacer 102 may be epitaxially grown oxide. In FIG. 16, a planarization process, such as chemical mechanical planarization (CMP), is performed to remove the sidewall spacer 102 from, and to expose, the top surface 104 of the features 72. After exposing the top surface 104 of the features 72, the features 72 are pulled or etched from the semiconductor substrate 12. As a result, the mask 70 is formed by the remaining sidewall spacer segments 110 as shown in FIG. 17.

Figure 18:
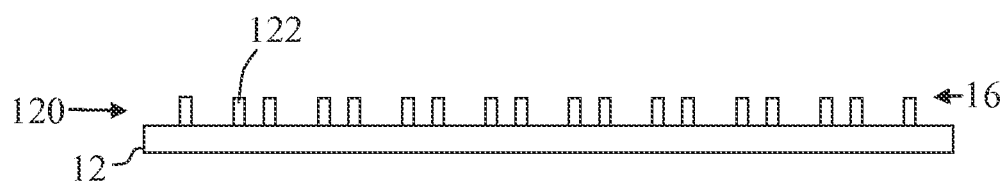
Figure 19:
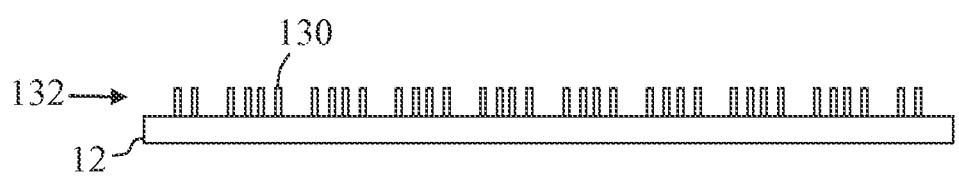

The target layer 14 or semiconductor substrate 12 may be etched using the mask 70. Alternatively, an intermediate layer, such as layer 16, may be etched as shown in FIG. 18 to form an intermediate mask 120 including hard mask segments 122. In FIG. 18, the mask 70 is removed from the intermediate mask 120. Then, as shown in FIG. 19, second sidewall spacers 130 are formed adjacent the hard mask segments 122 and the hard mask segments 122 are removed. The sidewall spacers 130 form a final mask 132 through which the semiconductor substrate 12 or target layer 14 may be etched.

The integrated circuit fabrication methods described herein provide for integrated circuits with features having sub-lithographic dimensions. Further, the methods are not limited to ¼ or ⅛ scaling and can provide ⅓, ⅙ or ⅑ scaling of minimum critical dimension associated with the lithographic process.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A method for fabricating an integrated circuit, the method comprising:
    forming first hard mask segments overlying an intermediate layer and a underlying layer;
    forming sacrificial mandrels overlying the intermediate layer and the underlying layer and adjacent each first hard mask segment;
    forming second hard mask segments overlying the intermediate layer and the underlying layer and adjacent each sacrificial mandrel;
    removing the sacrificial mandrels;
    forming sidewall spacers surrounding each first hard mask segment and each second hard mask segment;
    removing the first hard mask segments and second hard mask segments;
    etching the intermediate layer using the sidewall spacers as an intermediate mask to form intermediate mandrels;
    forming final spacers surrounding each intermediate mandrel;
    removing the intermediate mandrels; and
    etching the underlying layer using the final spacers as a final mask to form final mandrels.

2. The method of claim 1 further comprising etching a material using the final mandrels as a mask.

3. The method of claim 1 wherein forming the sacrificial mandrels overlying the intermediate layer and the underlying layer and adjacent each first hard mask segment comprises:
    depositing a mandrel-forming layer onto the intermediate layer and onto the first hard mask segments; and
    etching the mandrel-forming layer to form the sacrificial mandrels.

4. The method of claim 3 wherein forming the second hard mask segments overlying the intermediate layer and the underlying layer and adjacent each sacrificial mandrel comprises:
    depositing a hard mask layer onto the intermediate layer, onto the sacrificial mandrels, and onto the first hard mask segments; and
    etching the hard mask layer to form the second hard mask segments.

5. The method of claim 1 wherein:
    forming the first hard mask segments overlying the intermediate layer and the underlying layer comprises forming first hard mask segments defining a pitch distance from a first side of a selected first hard mask segment to a first side of a respective adjacent first hard mask segment; and
    forming the second hard mask segments overlying the intermediate layer and the underlying layer and adjacent each sacrificial mandrel comprises forming the second hard mask segments defining a minimum pitch distance from the first side of the selected first hard mask segment to a first side of a nearest adjacent second hard mask segment, and wherein the reduced pitch distance is equal to about one-third of the pitch distance.

6. The method of claim 1 wherein forming the first hard mask segments overlying the intermediate layer and the underlying layer comprises forming each first hard mask segment with a width and defining a pitch distance from a first side of a selected first hard mask segment to a first side of a respective adjacent first hard mask segment, wherein the width is equal to about one-sixth of the pitch distance.

7. A method for fabricating an integrated circuit, the method comprising:
    forming a mask overlying a material by
        forming first mandrels overlying the material and defining a pitch distance from a first side of a selected first mandrel to a first side of a respective adjacent first mandrel;
        forming first mask segments adjacent each first mandrel overlying the material;
        forming second mandrels adjacent each first mask segment overlying the material and defining a minimum pitch distance from the first side of the selected first mandrel to a first side of a respective nearest second mandrel, wherein the minimum pitch distance is equal to about one-third of the pitch distance;
        forming second mask segments overlying the material and each second mandrel; and
        removing the first and second mandrels to form gaps adjacent the first and second mask segments; and
    etching the material through the mask.

8. The method of claim 7 wherein forming the first mandrels comprises forming the first mandrels having a width equal to about one-sixth of the pitch distance.

9. The method of claim 7 wherein forming the first mandrels comprises forming the first mandrels having a first width equal to about one-sixth of the pitch distance, and wherein forming the second mandrels comprises forming the second mandrels having a second width equal to the first width equal.

10. The method of claim 7 wherein forming the mask overlying the material comprises:
    forming the mask overlying a first intermediate layer;
    forming sidewall spacers adjacent each first mask segment and each second mask segment;
    removing the first and second mask segments;
    etching the first intermediate layer using the sidewall spacers as an intermediate mask to form intermediate mandrels;
    forming final spacers adjacent each intermediate mandrel; and
    removing the intermediate mandrels to form the mask.

11. The method of claim 7 wherein:
    forming the mask overlying the material comprises forming the mask overlying a first intermediate layer and a second intermediate layer;
    forming sidewall spacers adjacent each first mask segment and each second mask segment;
    removing the first and second mask segments;
    etching the first intermediate layer using the sidewall spacers as an intermediate mask to form intermediate mandrels;
    forming final spacers adjacent each intermediate mandrel;
    removing the intermediate mandrels; and
    etching the second intermediate layer using the final spacers as a final mask to form final mandrels.

12. A method for fabricating an integrated circuit, the method comprising:
    forming a mask overlying a material by
        forming first mandrels overlying a material and defining a pitch distance from a first side of a selected first mandrel to a first side of a respective adjacent first mandrel, wherein each mandrel has a width equal to about one-sixth of the pitch distance;
        forming first mask segments adjacent each first mandrel overlying the material;
        forming second mandrels adjacent each first mask segment overlying the material;

forming second mask segments overlying the material and each second mandrel; and removing the first and second mandrels to form gaps adjacent the first and second mask segments; and etching the material through the mask.

13. The method of claim 12 wherein forming the mask overlying the material comprises:

forming the mask overlying a first intermediate layer;

forming sidewall spacers adjacent each first mask segment and each second mask segment;

removing the first and second mask segments;

etching the first intermediate layer using the sidewall spacers as an intermediate mask to form intermediate mandrels;

forming final spacers adjacent each intermediate mandrel; and removing the intermediate mandrels.

14. The method of claim 12 wherein forming the mask overlying the material comprises:

forming the mask overlying a first intermediate layer and a second intermediate layer;

forming sidewall spacers adjacent each first mask segment and each second mask segment;

removing the first and second mask segments;

etching the first intermediate layer using the sidewall spacers as an intermediate mask to form intermediate mandrels;

forming final spacers adjacent each intermediate mandrel;

removing the intermediate mandrels; and etching the second intermediate layer using the final spacers as a final mask to form final mandrels.

* * * * *